US009702950B2

(12) United States Patent
Homann et al.

(10) Patent No.: US 9,702,950 B2
(45) Date of Patent: Jul. 11, 2017

(54) REDUCING THE RADIO-FREQUENCY TRANSMIT FIELD IN A PREDETERMINED VOLUME DURING MAGNETIC RESONANCE IMAGING (75) Inventors: Hanno Heyke Homann, Hamburg (DE); Ingmar Graesslin, Boenningstedt (DE); Ulrich Katscher, Nortderstedt (DE); Tobias Ratko Voigt, London (GB); Olaf Helmut Dössel, Bruchsal (DE); Sebastian Alfred Seitz, Coelbe (DE)

(73) Assignee: KONINKLIJKE PHILIPS N.V., Eindhoven (NL)

(*) Notice: Subject to any disclaimer, the term of this patent is extended or adjusted under 35 U.S.C. 154(b) by 651 days.

(21) Appl. No.: 14/238,999

(22) PCT Filed: Aug. 15, 2012

(86) PCT No.: PCT/IB2012/054163
§ 371 (c)(1),
(2), (4) Date: Feb. 14, 2014

(87) PCT Pub. No.: WO2013/024449
PCT Pub. Date: Feb. 21, 2013

(65) Prior Publication Data
US 2014/0210472 A1 Jul. 31, 2014

Related U.S. Application Data (60) Provisional application No. 61/524,369, filed on Aug. 17, 2011.

(51) Int. Cl.
*G01R 33/28* (2006.01)
*G01R 33/36* (2006.01)
*G01R 33/561* (2006.01)

(52) U.S. Cl.
CPC .......... *G01R 33/36* (2013.01); *G01R 33/288* (2013.01); *G01R 33/5612* (2013.01); *G01R 33/285* (2013.01)

(58) Field of Classification Search
CPC .. G01R 33/36; G01R 33/288; G01R 33/5612; G01R 33/285; G01R 33/246;
(Continued)

(56) References Cited

U.S. PATENT DOCUMENTS 6,982,554 B2   1/2006   Kurpad
7,403,004 B2   7/2008   Morich et al.
(Continued)

FOREIGN PATENT DOCUMENTS

DE   WO 2009118688 A1 * 10/2009   ........... G01R 33/583
DE   WO 2010032172 A1 *  3/2010   ......... G01R 33/3415
(Continued)

OTHER PUBLICATIONS

Eryaman, Yigitcan et al "Reduction of Implant RF Heating Through Modification of Transmit Coil Electric Field", Magnetic Resonance in Medicine, vol. 65, 2011, pp. 1305-1313.
(Continued)

*Primary Examiner* — Clayton E LaBalle
*Assistant Examiner* — Ruifeng Pu (57) ABSTRACT A magnetic resonance imaging system (300) acquires magnetic resonance data (358) from a subject (318) that may include an electrically conductive object (e.g. an implant or a medical device). The magnetic resonance imaging system includes a radio-frequency transmitter (314) for generating a radio-frequency transmit field for acquiring the magnetic resonance data using a radio-frequency antenna (310). The radio-frequency transmitter has multiple transmit channels. The radio-frequency antenna comprises multiple antenna elements (312) each adapted to connect to an antenna
(Continued)

element. The amplitude and phase values of the RF transmit field of each of the transmit channels can be selected such that the magnetic field generated by the RF antenna is minimized at the location of the electrically conductive object, thereby reducing RF heating of the object.

19 Claims, 4 Drawing Sheets

(58) Field of Classification Search
CPC .............. G01R 33/3415; G01R 33/543; G01R 33/5608; G01R 33/34076; G01R 33/443; G01R 33/4804; G01R 33/4808; G01R 33/4814; G01R 33/4833; G01R 33/4836; G01R 33/546; G01R 33/5607; G01R 33/5611; G01R 33/5659; A61B 18/18; A61B 18/1815; A61B 18/20; A61B 2018/00791; A61B 5/055; A61F 7/00
See application file for complete search history.

(56) References Cited

U.S. PATENT DOCUMENTS

| | | | |
|---|---|---|---|
| 8,736,265 B2 | 5/2014 | Boernert et al. | |
| 8,847,593 B2 | 9/2014 | Boernert et al. | |
| 2005/0134270 A1 | 6/2005 | Dumoulin | |
| 2007/0247155 A1* | 10/2007 | Zhu | G01R 33/288 324/318 |
| 2008/0157765 A1 | 7/2008 | Fontius et al. | |
| 2008/0265889 A1 | 10/2008 | Zhai | |
| 2010/0179763 A1* | 7/2010 | Overall | G01R 33/246 702/19 |
| 2010/0237869 A1 | 9/2010 | Griswold et al. | |
| 2010/0241389 A1* | 9/2010 | Griswold | G01R 33/5612 702/106 |
| 2010/0253338 A1 | 10/2010 | Eryaman | |
| 2011/0043205 A1 | 2/2011 | Graesslin | |
| 2011/0066028 A1 | 3/2011 | Min | |
| 2011/0156704 A1 | 6/2011 | Boernert | |
| 2012/0139541 A1 | 6/2012 | Weiss | |
| 2012/0161766 A1 | 6/2012 | Harvey et al. | |
| 2012/0262174 A1* | 10/2012 | Voigt | G01R 33/246 324/309 |

FOREIGN PATENT DOCUMENTS

| | | | | |
|---|---|---|---|---|
| DE | EP 2624004 A1 * | 8/2013 | ......... | G01R 33/4804 |
| WO | WO 2007042951 A1 * | 4/2007 | ......... | G01R 33/3415 |
| WO | 2008077037 A2 | 6/2008 | | |
| WO | 2009118688 A1 | 10/2009 | | |

OTHER PUBLICATIONS

Nordbeck, Peter et al "Measuring RF-Induced Currents inside Implants: Impact of Device Configuration on MRI Safety of Cardiac Pacemaker Leads", Magnetic Resonance in Medicine, vol. 61, No. 3, 2009 Abstract Only.
Katscher, Ulrich et al "Determination of Electric Conductivity and Local SAR via B1 Mapping", IEEE Transactions on Medical Imaging, vol. 28, No. 9, Sep. 2009, pp. 1365-1374.
Eryaman, Yigitcan et al "Reduction of RF Heating of Metallic Devices using Transmit Arrays", Proc. International Society on Magnetic Resonance in Medicine, vol. 18, 2010, p. 3883.
Eryaman, Y. et al "Reduction of Implant RF Heating by Modification of Electric Field Distribution", Proc. International Society on Magnetic Resonance in Medicine, vol. 17, 2009, p. 304.
Wang, Jinghua et al "Measurement and Correction of Transmitter and Receiver Induced Nonuniformities in Vivo", Magnetic Resonance in Medicine, vol. 53, 2005, pp. 408-417.
Nordbeck, Peter et al "Spatial Distrubution of RF-Induced E-Fields and Implant Heating in MRI", Magnetic Resonance in Medicine, vol. 60, 2008, pp. 312-319.
Overall, William R. et al "Ensuring Safety of Implanted Devices under MRI using Refersed RF Polarization", Magnetic Resonance in Medicine, vol. 64, No. 3, 2010, pp. 823-833.

* cited by examiner

REDUCING THE RADIO-FREQUENCY TRANSMIT FIELD IN A PREDETERMINED VOLUME DURING MAGNETIC RESONANCE IMAGING

CROSS-REFERENCE TO PRIOR APPLICATIONS

This application is the U.S. National Phase application under 35 U.S.C. §371 of International Application No. PCT/IB2012/054163, filed on Aug. 15, 2012, which claims the benefit of U.S. Provisional Patent Application No. 61/524,369 filed on Aug. 17, 2011. These applications are hereby incorporated by reference herein.

TECHNICAL FIELD

The invention relates to magnetic resonance imaging, in particular it relates to performing imaging in the vicinity of electrically conductive objects.

BACKGROUND OF THE INVENTION

In magnetic resonance imaging, a large magnetic field is used to align the nuclear spins of atoms as part of the procedure for producing images within the body of a subject. Magnetic resonance imaging is typically used to map the location of protons, such as those in a water molecule, within a subject. Magnetic resonance imaging is much better than X-ray techniques such as CT at imaging soft tissues and showing the detailed anatomical structures of soft tissues. However, the large magnetic field and radio-frequency signals used for magnetic resonance imaging prevents the use of some materials, such as conductors, and electronics within the magnetic resonance imaging volume. This is because the radio-frequency electromagnetic field generated during magnetic resonance imaging may cause heating these materials or electronics and the surrounding tissues.

Eryaman et al, Magnetic Resonance in Medicine, Volume 65 (2011), pages 1305 to 1313, discloses the modification of the electric-field distribution of a radio-frequency coil to generate electric field-free zones in a subject without altering the transmit sensitivity.

SUMMARY OF THE INVENTION

The invention provides for a magnetic resonance imaging system, a method of operating the magnetic resonance imaging system, and a computer program product in the independent claims Embodiments are given in the dependent claims.

A disadvantage of the prior art is that suppressing just the electric field can lead to uncontrolled electric fields which are dependent upon the electrical properties and shape of the object within the subject. Embodiments of the invention may address this and other problems by controlling the input drive scales for a multi-channel magnetic resonance imaging system such that the magnetic field component of the radio-frequency transmit field is kept below a predetermined value. This may have the advantage of reducing the radio-frequency heating of the object without a detailed knowledge of the object. It is only necessary to identify the region which contains the object and reduce the magnetic component of the radio-frequency transmit field in this region.

A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. References to a computer-readable storage medium should be interpreted as possibly being multiple computer-readable storage mediums. Various executable components of a program or programs may be stored in different locations. The computer-readable storage medium may for instance be multiple computer-readable storage medium within the same computer system. The computer-readable storage medium may also be computer-readable storage medium distributed amongst multiple computer systems or computing devices.

'Computer memory' or 'memory' is an example of a computer-readable storage medium. Computer memory is any memory which is directly accessible to a processor. Examples of computer memory include, but are not limited to: RAM memory, registers, and register files. References to 'computer memory' or 'memory' should be interpreted as possibly being multiple memories. The memory may for instance be multiple memories within the same computer system. The memory may also be multiple memories distributed amongst multiple computer systems or computing devices.

'Computer storage' or 'storage' is an example of a computer-readable storage medium. Computer storage is any non-volatile computer-readable storage medium. Examples of computer storage include, but are not limited to: a hard disk drive, a USB thumb drive, a floppy drive, a smart card, a DVD, a CD-ROM, and a solid state hard drive. In some embodiments computer storage may also be computer memory or vice versa. References to 'computer storage' or 'storage' should be interpreted as possibly being multiple storage devices. The storage may for instance be multiple storage devices within the same computer system or computing device. The storage may also be multiple storages distributed amongst multiple computer systems or computing devices.

A 'processor' as used herein encompasses an electronic component which is able to execute a program or machine executable instruction. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. Many programs have their instructions performed by multiple processors that may be within the same computing device or which may even be distributed across multiple computing devices.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, gear sticks, steering wheel, pedals, wired glove, dance pad, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, wireless local area network connection, TCP/IP connection, Ethernet connection, control voltage interface, MIDI interface, analog input interface, and digital input interface.

Magnetic Resonance (MR) data is defined herein as being the recorded measurements of radio frequency signals emitted by atomic spins by the antenna of a magnetic resonance apparatus during a magnetic resonance imaging scan. A Magnetic Resonance Imaging (MRI) image is defined herein as being the reconstructed two or three dimensional visualization of anatomic data contained within the magnetic resonance imaging data. This visualization can be performed using a computer.

In one aspect the invention provides for a magnetic resonance imaging system for acquiring magnetic resonance data from a subject within an imaging zone. The imaging zone is a zone of the magnetic resonance imaging system from which the magnetic resonance data is acquired. The magnetic resonance imaging system comprises a radio-frequency transmitter for generating a radio-frequency transmit field for acquiring the magnetic resonance data using a radio-frequency antenna. Essentially the radio-frequency transmitter is adapted for attaching to a radio-frequency antenna. As used herein the radio-frequency transmit field is a radio-frequency electromagnetic field which is used to excite atomic spins within the imaging zone for obtaining a magnetic resonance image. The radio-frequency transmitter has multiple transmit channels. The radio-frequency antenna comprises multiple antenna elements. Each of the multiple transmit channels are adapted to connect to an antenna element chosen from the multiple antenna elements. In some instances the number of transmit channels and antenna elements is equal. In other embodiments a multiplexer may be used to connect the multiple transmit channels to a larger number of multiple antenna elements.

The magnetic resonance imaging system further comprises a memory for storing machine executable instructions. The magnetic resonance imaging system further comprises a processor for executing the machine executable instructions. The processor is configured for controlling the magnetic resonance imaging system. Execution of the machine executable instructions causes the processor to receive a set of radio-frequency sensitivities. The radio-frequency sensitivities are descriptive of the radio-frequency sensitivities of the multiple antenna elements when the subject is within the imaging zone. A radio-frequency sensitivity of an antenna element as used herein encompasses a spatially dependent function which expresses the magnetic field and/or electric field generated by a given radio-frequency voltage or radio-frequency current flowing through the antenna element. If the radio-frequency sensitivities are known then the electric and/or magnetic field generated is known as a function of the radio-frequency current or voltage.

Execution of the instructions further causes the processor to calculate a set of input drive scales for the multiple transmit channels in accordance with the radio-frequency sensitivities. An input drive scale as used herein is a value or scaling factor used to determine an adjustment in the amplitude and/or phase of radio-frequency power applied to a particular antenna element. An input drive scale is descriptive of the amplitude and phase of radio-frequency emissions generated by each of the multiple transmit channels. The input drive scales can reduce a magnetic field generated by the radio-frequency antenna within a predetermined volume to below a first predetermined value. The predetermined volume is within the subject. The radio-frequency sensitivities are chosen such that a particular volume within the subject has a magnetic field strength below the first predetermined value. Execution of the instructions further causes the processor to acquire the magnetic resonance data using the magnetic resonance imaging system. The radio-frequency emissions are generated in accordance with the set of input drive scales. That is to say the input drive scales are used during the generation of the radio-frequency transmit field during the acquisition of magnetic resonance data. This embodiment of the invention may be beneficial because the magnetic field strength within the predetermined volume is limited to the first predetermined value. If for instance a metallic or other conducting object is located within the predetermined volume the limiting of the magnetic field may be used to help minimize heating by the metallic object.

In another embodiment execution of the instructions further causes the processor to acquire preliminary magnetic resonance data using the magnetic resonance imaging system. The preliminary magnetic resonance data may be magnetic resonance data of various types such as proton density or magnetic field strength measurements. The preliminary magnetic resonance data is used for planning and/or for generating the set of radio-frequency sensitivities. Execution of the instructions further causes the processor to locate the predetermined volume using the preliminary magnetic resonance data. For instance image segmentation methods may be used on a proton density image to locate the predetermined volume.

The use of the multiple transmit channels and antenna elements enables the magnetic field to be reduced within the predetermined volume.

In another embodiment an electrically conductive object is located within the predetermined volume. This embodiment may be particularly advantageous because an electrically conductive object may be heated by the radio-frequency transmit field. Reducing the magnetic field component of the radio-frequency transmit field within the predetermined volume may reduce or limit the radio-frequency heating of the electrically conductive object. This may help reduce the chance that the subject is inadvertently burned by heating of the electrically conductive object.

In another embodiment execution of the instructions further causes the processor to determine an orientation of the electrically conductive object using the preliminary magnetic resonance data. Execution of the instructions further causes the processor to at least partially calculate the set of radio-frequency sensitivities using the preliminary magnetic resonance data and an electromagnetic model of the electrically conductive object. If an electromagnetic model of the electrically conductive object is used it may be possible to adjust the direction and/or magnitude of the radio-frequency transmit field in such a way as to reduce the heating of the electrically conductive object caused by the radio-frequency transmit field. For instance the electrically conductive object may have portions or a portion which functions as a current loop. Adjusting the radio-frequency transmit field in a direction which minimizes the generated current in the electrically conductive object may reduce heating.

In another embodiment execution of the instructions further causes the processor to determine an orientation of the electrically conductive object using the preliminary magnetic resonance data. The set of input drive scales are further calculated at least partially using the orientation of the electrically conductive object such that the radio-frequency heating of the electrically conductive object and/or patient tissue within a predetermined distance of the electrically conductive object is reduced. This embodiment may have the benefit of reducing the chance of the subject being burned by radio-frequency heating of the electrically conductive object. The electrically conductive object may be for example but is not limited: an implant, a guidewire, and/or a catheter.

In another embodiment execution of the instructions further causes the processor to determine a position of the electrically conductive object. The position may also include an orientation of the electrically conductive object. The set of input drive scales are further calculated at least partially using the position of the electrically conductive object such that the radio-frequency heating of the electrically conductive object and/or patient tissue within a predetermined distance of the electrically conductive object is reduced. The direction of the electric and magnetic components of the radio-frequency transmit field may be able to be adjusted using a knowledge of the position and/or orientation of the electrically conductive object such that the electrical heating of the electrically conductive object is reduced. This may have the benefit of reducing the likelihood that the subject is burned during the acquisition of magnetic resonance data.

In another embodiment the set of input drive scales are calculated at least partially using a model of the electrically conductive object. The model may for instance have a response to electromagnetic fields designed into it or it may also contain an electro-mechanical specification which specifies the location and electrical resistance of current loops and other conductive material which may be used for calculating the heating caused by the application of the radio-frequency transmit field.

In some embodiments the model of the electrically conductive object is a finite elements model.

In another embodiment execution of the instructions further causes the processor to at least partially calculate the set of radio-frequency sensitivities using the preliminary magnetic resonance data and an electromagnetic model of the subject. The preliminary magnetic resonance data may be used to identify the position and location of the subject relative to the multiple antenna elements. Knowing the location of the subject relative to the antenna elements an electromagnetic model can be constructed which allows the calculation of the radio-frequency sensitivities. This may be for instance achieved using a finite elements analysis.

In another embodiment the radio-frequency sensitivities comprise magnetic field sensitivities.

In another embodiment execution of the instructions further causes the processor to measure the magnetic field sensitivities using the magnetic resonance imaging system. This may for instance be done during the acquisition of the preliminary magnetic resonance data. Using known techniques the magnetic field generated by each antenna element may be measured within the subject. This embodiment may have the benefit of providing an empirical measurement of the magnetic field sensitivities.

In another embodiment the radio-frequency sensitivities comprise electric field sensitivities. The electric field sensitivities are calculated at least partially using the magnetic field sensitivities. In some embodiments the electromagnetic model of the subject is also used to calculate the magnetic field sensitivities. Because the electromagnetic and magnetic fields are connected in a radio-frequency transmit field a complete knowledge of the magnetic field sensitivities may be used to calculate the electric field sensitivities. This is particularly true when a model of the subject is available. A partial knowledge of the magnetic field sensitivities may be sufficient if the remaining field components are known to be small relative to the known field components.

In another embodiment the set of input drive scales is calculated at least partially using the electric field sensitivities. The radio-frequency transmit field generated by the radio-frequency transmitter in the predetermined volume is sufficient to enable magnetic resonance imaging. This embodiment may be beneficial because the magnetic resonance image may be acquired for the predetermined volume. However, the magnetic field within the predetermined volume has been kept below the first predetermined value. This may enable the imaging of the predetermined volume in such a way that the risk of burning the subject due to heating of the electrically conductive object is minimized.

In another aspect the invention provides for a method of operating a magnetic resonance imaging system for acquiring magnetic resonance data from a subject within an imaging zone. The magnetic resonance imaging system comprises a radio-frequency transmitter for generating a radio-frequency transmit field for acquiring the magnetic resonance data using a radio-frequency antenna. The radio-frequency transmitter has multiple transmit channels. The radio-frequency antenna comprises multiple antenna elements. Each of the multiple transmit channels is adapted to connect to an antenna element chosen from the multiple antenna elements. The method comprises the step of receiving a set of radio-frequency sensitivities. The radio-frequency sensitivities are descriptive of the radio-frequency sensitivities of the multiple antenna elements when the subject is within the imaging zone. The method further comprises the step of calculating a set of input drive scales for the multiple transmit channels in accordance with the radio-frequency sensitivities. An input drive scale is descriptive of the amplitude and phase of the radio-frequency emissions generated by each of the multiple transmit channels. The input drive scales can reduce a magnetic field generated by the radio-frequency antenna within a predetermined volume to below a first predetermined value. The predetermined volume is within the subject. The method further comprises the step of acquiring the magnetic resonance data using the magnetic resonance imaging system. The radio-frequency emissions are generated in accordance with the set of input drive scales. The advantages of this method have been previously discussed.

The method further comprises the step of placing the subject at least partially within the imaging zone. In some embodiments there is an electrically conductive object within the determined volume. In some embodiments the subject is placed within the imaging zone such that the determined volume is located within the imaging zone.

In another aspect the invention provides for a computer program product comprising machine executable instructions for execution by a processor configured for controlling the magnetic resonance imaging system. The magnetic resonance imaging system is configured for acquiring magnetic resonance data from a subject within an imaging zone. The magnetic resonance imaging system comprises a radio-frequency transmitter for generating a radio-frequency transmit field for acquiring the magnetic resonance data using a radio-frequency antenna. The radio-frequency transmitter has multiple transmit channels. The radio-frequency antenna comprises multiple antenna elements. Each of the multiple transmit channels are adapted to connect to the antenna element chosen from the multiple antenna elements.

Execution of the instructions causes the processor to receive a set of radio-frequency sensitivities. The radio-frequency sensitivities are descriptive of the radio-frequency sensitivities of the multiple antenna elements when the subject is within the imaging zone. Execution of the instructions further causes the processor to calculate a set of input drive scales for the multiple transmit channels in accordance with the radio-frequency sensitivities. An input drive scale is descriptive of the amplitude and phase of the radio-frequency emissions generated by each of the multiple transmit channels. The input drive scales can reduce the magnetic field generated by the radio-frequency antenna within a predetermined volume to below a first predetermined value. The predetermined volume is within the subject. Execution of the instructions further causes the processor to acquire the magnetic resonance data using the magnetic resonance imaging system. The radio-frequency transmit field is generated in accordance with the set of input drive scales. The advantages of this computer program product have been previously discussed.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
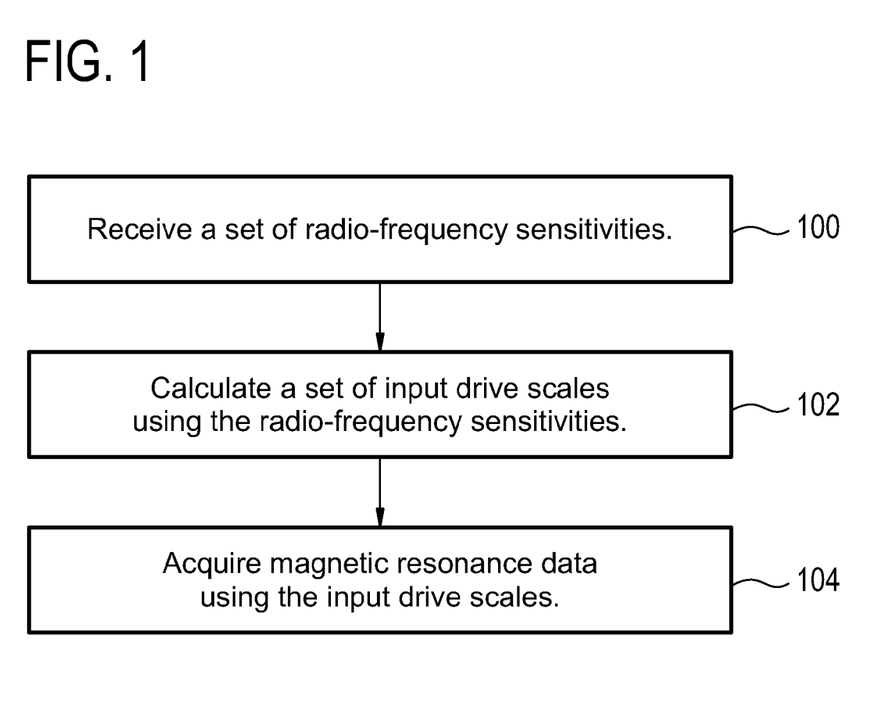
FIG. 1 shows a flow diagram which illustrates a method according to an embodiment of the invention.

FIG. 1 shows a flow diagram which illustrates a method according to an embodiment of the invention. In step 100 a set of radio-frequency field sensitivities are received. In some embodiments this may also include calculating the set of radio-frequency sensitivities from preliminary magnetic resonance data. Next in step 102 a set of input drive scales are calculated using the radio-frequency sensitivities. Finally in step 104 magnetic resonance data is acquired using the input drive scales. The input drive scales are used to determine the voltage and/or current applied to the multiple antenna elements in order to generate the radio-frequency transmit field.

In an alternative embodiment the subject is placed at least partially within the imaging zone before the set of radio-frequency sensitivities are received.

Figure 2:
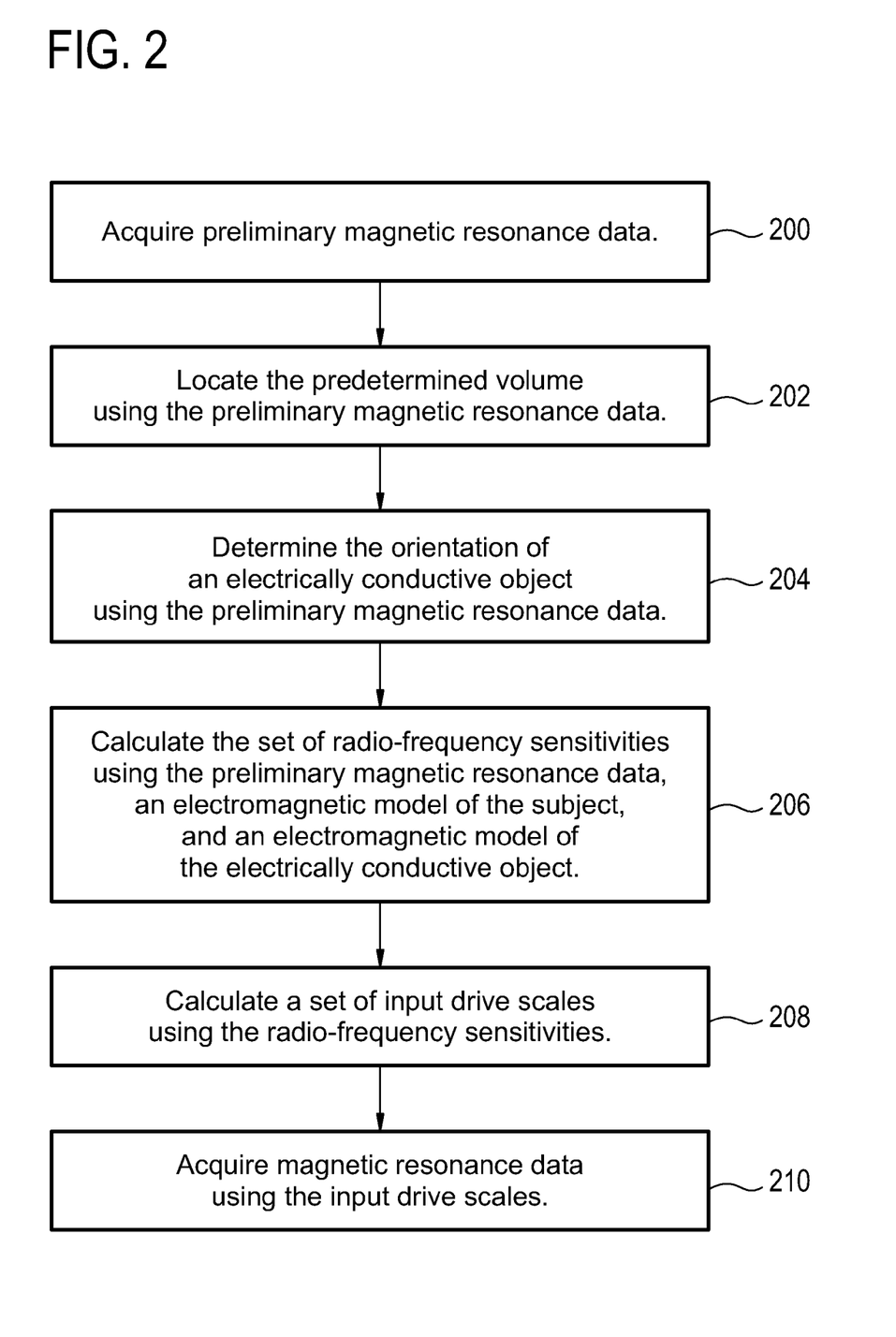
FIG. 2 shows a flow diagram which illustrates a method according to a further embodiment of the invention.

FIG. 2 shows a flow diagram which illustrates a method according to a further embodiment of the invention. In step 200 preliminary magnetic resonance data is acquired. Next in step 202 the predetermined volume is located using the preliminary magnetic resonance data. For instance an image segmentation module may be used to locate the predetermined volume using anatomical reference marks. In step 204 the position and/or orientation of the electrically conductive object within the predetermined volume is determined using the preliminary magnetic resonance data. Again this may be accomplished using segmentation techniques. Next in step 206 the set of radio-frequency sensitivities are calculated using the preliminary magnetic resonance data, an electromagnetic model of the subject, and an electromagnetic model of the electrically conductive object. Next in step 208 a set of input drive scales are calculated using the radio-frequency sensitivities. Finally in step 210 the magnetic resonance data is acquired using the input drive scales.

Figure 3:
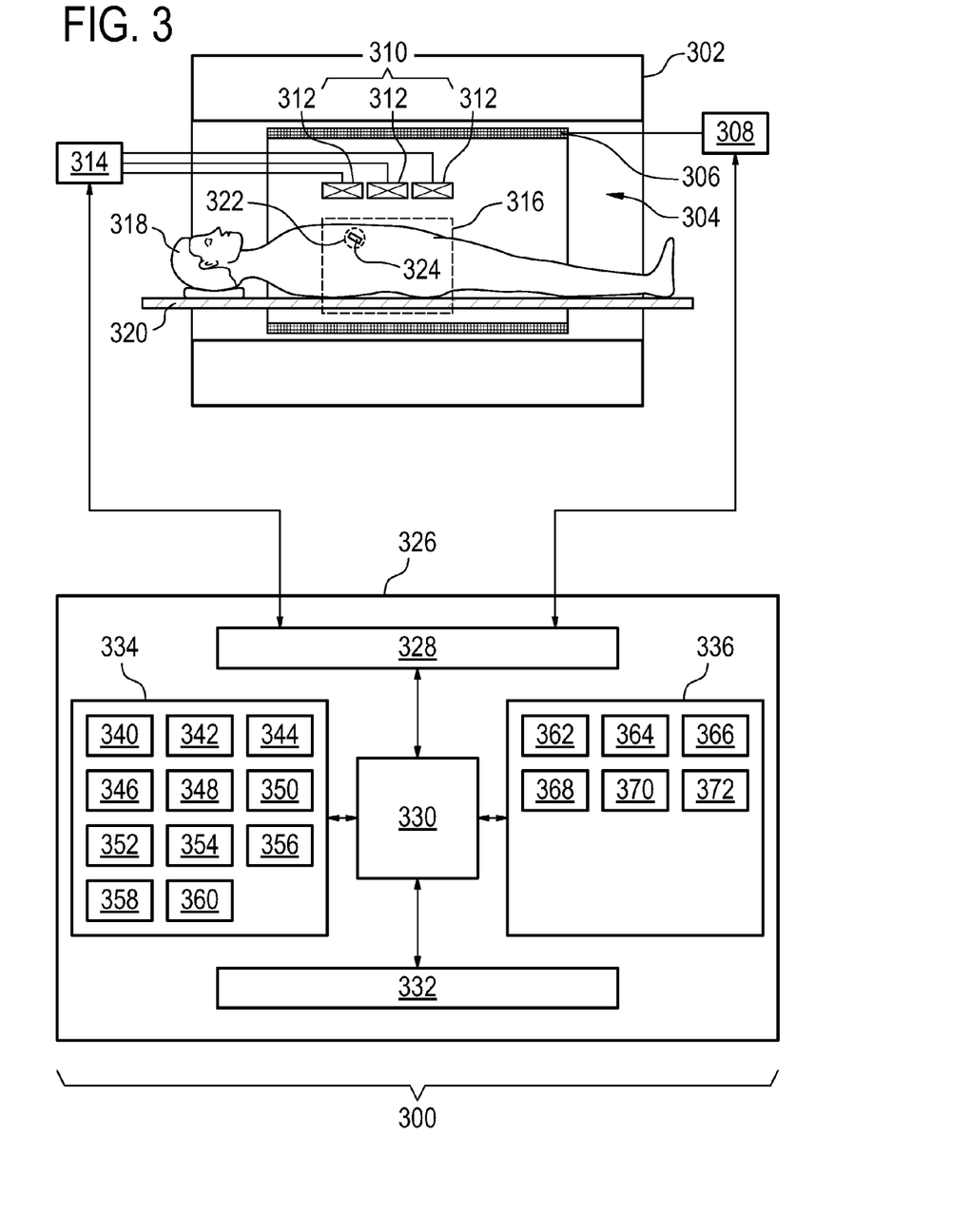
FIG. 3 illustrates a magnetic resonance imaging system 300 according to an embodiment of the invention.

FIG. 3 illustrates a magnetic resonance imaging system 300 according to an embodiment of the invention. The magnetic resonance imaging system is shown as comprising a magnet. The magnet 302 is a cylindrical type superconducting magnet. The magnet has a liquid helium cooled cryostat with superconducting coils. It is also possible to use permanent magnets, resistive magnets, and/or nitrogen cooling. The use of different types of magnets is also possible for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils. Within the bore 304 of the cylindrical magnet there is an imaging zone 316 where the magnetic field is strong and uniform enough to perform magnetic resonance imaging.

Within the bore of the magnet there is a magnetic field gradient coil 306 which is used for acquisition of magnetic resonance data to spatially encode magnetic spins within the imaging zone 316 of the magnet 302. The magnetic field gradient coil 306 is connected to a magnetic field gradient coil power supply 308. The magnetic field gradient coil 306 is intended to be representative. Typically magnetic field gradient coils contain three separate sets of coils for spatially encoding in three orthogonal spatial directions. A magnetic field gradient power supply supplies current to the magnetic field gradient coils. The current supplied to the magnetic field coils 306 is controlled as a function of time and may be ramped or pulsed.

Adjacent to the imaging zone 316 is a radio frequency antenna 310 for manipulating the orientations of magnetic spins within the imaging zone and for receiving radio transmissions from spins also within the imaging zone. The radio-frequency antenna 310 has multiple antenna elements 312. In this example only three elements 312 are shown. However, in an actual system there may be a larger number of elements 312. Each antenna element 312 is connected to a transceiver 314.

Each of the elements 312 may be referred to as a channel. The radio frequency antenna 310 is connected to a radio frequency transceiver. The radio frequency coil and radio frequency transceiver may be replaced by separate transmit and receive coils and a separate transmitter and receiver. It is understood that the radio frequency coil and the radio frequency transceiver are simply representative. The radio frequency antenna is intended to also represent a dedicated transmit antenna and a dedicated receive antenna. Likewise the transceiver may also represent separate transmitters and receivers.

A subject 318 is within the bore 304 and is partially within the imaging zone 316. The subject 318 is reposing on a subject support 320. Within the subject 318 there is a predetermined volume 322 located within the imaging zone 316. Within the predetermined volume 322 is an electrically conductive object 324. By controlling the amplitude and phase of radio-frequency power delivered to each of the antenna elements 312 the magnetic field and/or electric field generated by the radio-frequency transmit field within the predetermined volume 322 is minimized. The electrically conductive object 324 may be for example a catheter or an implant. The magnetic field gradient coil power supply 308 and the transceiver 314 are both connected to a hardware interface 328 of computer system 326. The hardware interface 328 is connected to a processor 330. The processor is able to control the operation and function of the magnetic resonance imaging system 300 via the hardware interface 328. The processor 330 is further connected to a user interface 332, computer storage 334, and computer memory 336.

The computer storage 334 is shown as containing a pulse sequence 340. A pulse sequence used herein is a sequence of commands which the magnetic resonance imaging system 300 may use for controlling various components for acquiring the magnetic resonance data. The computer storage 334 is further shown as containing preliminary magnetic resonance data that was acquired using a pulse sequence 340. The pulse sequence 340 may also be multiple pulse sequences used for different purposes. The computer storage 334 is further shown as containing a preliminary magnetic resonance image 344 reconstructed from the preliminary magnetic resonance data 342. The computer storage 334 is further shown as containing an image segmentation 346 of the preliminary magnetic resonance image 344. The computer storage is further shown as containing a location of the predetermined volume 348, a location of the electrically conductive object 350, and an orientation of the electrically conductive object 352 which will be determined (?) using the image segmentation 346. The computer storage 334 is further shown as containing a set of radio-frequency sensitivities 354. The computer storage 334 is further shown as containing an input drive scale 356. The computer storage 334 is further shown as containing magnetic resonance data 358 that was acquired using a pulse sequence 340. The computer storage 334 is further shown as containing a magnetic resonance image 360 that was reconstructed from the magnetic resonance data 358. The preliminary magnetic resonance data 342 may for instance be acquired using lower power radio-frequency transmit field to avoid heating the electrically conductive object 324.

The computer memory 336 is shown as containing a control module 362. The control module contains computer executable code which allows the processor 330 to control the operation and function of the magnetic resonance imaging system 300. For instance the control module 362 may use the pulse sequence 340 to generate control commands which cause the acquisition of the preliminary magnetic resonance data 342 and/or the magnetic resonance data 358. The computer memory 336 is further shown as containing an image reconstruction module 364. The image reconstruction module 364 contains computer executable code which causes the processor 330 to reconstruct magnetic resonance data such as the preliminary magnetic resonance data 342 and the magnetic resonance data 358 into the preliminary magnetic resonance image 344 and the magnetic resonance image 360.

The computer memory 336 is further shown as containing electromagnetic modeling module 366. The electromagnetic modeling module 366 may be used to construct electromagnetic models of the electrically conductive object 324 and/or the subject 318 and/or the antenna elements 312. The electromagnetic modeling module may for instance be implemented as a finite element modeling system. The computer memory 336 further contains a segmentation module 368. The segmentation module 368 was used to generate the image segmentation 346. The computer memory 336 is further shown as containing a radio-frequency sensitivity calculation module 370 which may generate radio-frequency sensitivities 354 from possibly the preliminary magnetic resonance data 342 and/or results from electromagnetic modeling performed with the electromagnetic modeling module 366. The computer memory 336 is further shown as containing an input drive scale calculation module 372. The input drive scale calculation module 372 contains computer executable code which allows the calculation of the input drive scales 356 from the radio-frequency sensitivities 354.

Many medical implants or other devices such as catheters present a potential danger by coupling to the RF field and resulting local heating. This heating is a result of both the electric and the magnetic part of the RF field. Embodiments of the invention may reduce or minimize this heating by using Parallel Transmit MRI to reduce the RF field for safe MR imaging, even without exact modeling of the implant. This may be achieved by optimizing for a homogeneous transmit field in the imaging area, while minimizing the electric and the magnetic field components simultaneously in the area of the implant.

The optimization may be performed based on patient-specific electro-magnetic field maps, obtained (a) by suitable numerical modeling of the individual patient, or (b) by measuring the magnetic field components and subsequent derivation of the corresponding electric field components, or a combination of methods (a) and (b).

Moreover, the different spatial components of the electric and magnetic field have different impact on potential device heating. Thus, field optimization can also be performed with respect to the different spatial field components for improved image quality.

Localized heating of implants or other medical devices and their surrounding tissue, resulting from exposure to the radio-frequency (RF) excitation field, is a potential hazard to the patient during a magnetic resonance imaging (MRI) examination. This is potentially problematic for implants of elongated shape or forming conductive loops, e.g. lead wires or catheters. Furthermore, such devices may cause artifacts, such as erroneous local signal amplification or signal voids in the MR images due to electro-magnetic coupling to the RF field. In some cases, there is also the danger of impairing the functionality of the corresponding device due to exposure to the RF field.

Parallel Transmission MRI systems allow for spatial optimization of the RF field, which is typically used to improve image homogeneity. The RF field comprises two components, the electrical field and the magnetic field, which are closely coupled via Maxwell's equations. The RF field potentially causes electrical currents in and around the implant and hence thermal damage to the surrounding body tissues. The electric field component in the area where the implant is located can be minimized by the use of Parallel Transmission MRI in order to minimize implant heating while attempting achieving a uniform distribution of the magnetic field component in the imaging plane. However, this approach has been limited to simulation studies due to a lack of knowledge about the exact RF field distribution inside the human body, especially in the close proximity of a medical device, during an MR scan.

Reduction of RF related implant heating in practical in-vivo MRI examinations is impeded for several reasons:
1. If the electric field sensitivities of each transmit channel of a parallel transmit MRI system were exactly known, it would in principle be sufficient to minimize the electric field in the area of an implanted device to avoid local heating. In practice, the presence of a device can lead to major distortions of the RF field. The resulting electric field is hence highly difficult to predict. Numerical modeling of the RF field in the area of the device would require precise knowledge of the device location and orientation, eventually including lead wires. Such detail is currently not robustly achievable.
2. Even without any devices present, the electric (and magnetic) field distribution in the patient body depends on the individual patient anatomy. Using homogeneous, cylindrical models is insufficient to guarantee patient safety in RF field optimization by parallel transmit MRI.

These issues may be addressed by embodiments of the invention by means of dedicated patient specific localized control of the electric and magnetic field components using Parallel Transmission MRI.

The features of some embodiments of the invention include:
1. As the prediction of the electric field is difficult in the presence of medical devices, it is proposed to minimize the electric and the magnetic field components simultaneously in a region around of the device. This may be limited to parts of that region that can cause heating, e.g. due to conductive connections to the patient tissue. Minimizing the magnetic field in addition to minimizing the electric field, prevents the induction of electric fields, and hence electric currents, according to Faraday's law due to the presence of the device. This is independent of the actual type and location of the device such that no detailed model of the device is required. It should be noted that MR imaging will be limited to regions adjacent to the region of the implant and the remaining body but is limited at the device itself. This way imaging can be conducted safely even in the presence of devices that would normally be considered unsafe.
2. Patient-specific estimates of the electric field sensitivities may be used in the optimization of the RF field. This is in addition to patient-specific estimates of the magnetic field sensitivities as commonly done in RF field optimization parallel transmit MRI. The estimates of the electric field sensitivities could be obtained a) based on numerical simulations using patient-specific models or b) based on measurements of the magnetic field sensitivities using the MRI system and to calculate the corresponding electric field sensitivities using Maxwell's equations. The approaches a) and b) might be combined.
3. Moreover, the different spatial components of the electric and magnetic field have different impact on potential device heating. Given the estimates of the electric and magnetic field sensitivities as 3D vector fields, the optimization can be performed anisotropically with respect to the different spatial field components to improve the degree of freedom in the optimization for improved MR image quality.

Embodiments of a Parallel Transmission MRI system may perform one or more of the following steps:
1. Obtain patient-specific information about the electric field sensitivities $S_E(x)$ and magnetic field sensitivities $S_{B1}(x)$, with x being the spatial location, for each transmit channel.

The electric and magnetic field sensitivities for each transmit channel are both complex vector fields in space, with each element of the vector consisting of three independent spatial components. A numerical simulation using a patient-specific body model can potentially make all these components available.

Instead of a simulation, the relevant components of the sensitivities may be obtained from measurements of the clockwise-polarized component of the magnetic field component which is accessible to measurement using the MR scanner. In particular, the counter-clockwise-polarized component of the magnetic field component and the axial component along the scanner bore of the magnetic field component are often relatively small and may be negligible for safety assessment. If this is the case, the dominating component of the electric field is oriented along the scanner bore and can be calculated using Ampere's law from the measured clockwise-polarized component of the magnetic field component.

Furthermore, mirror symmetries of the MRI system and the patient body might be used to obtain an estimate of the counter-clockwise-polarized component of the magnetic field component and to improve the calculation of the electric field components. Alternatively, the counter-clockwise-polarized component can also be estimated by removing relaxation effects and the transmit profile from an MR image. Here, the resulting receive sensitivity is weighted with the spin density, which however might be an acceptable approximation.

If the magnetic field parallel to the bore axis is too large to be neglected, it can be estimated by the phase changes caused by driving the transmit coil in a DC mode.

Finally, it should be noted that many elongated medical devices (especially catheters and pacemaker leads) are often oriented parallel to the bore axis of the patient, which is beneficial for the applicability of this invention as those field components that couple to the device (the electric field component in axial direction and the clockwise-polarized component of the magnetic field) are accessible by measurement.

2. Identify the location and orientation of a medical device relative to the patient and to the MRI system manually by the operator or via suitable MR imaging. Frequently, a medical device in the patient is not directly visible in the MR image, but causes a signal void in the image. However, also this signal void can be used to estimate location/orientation of the device. The use of the reversed quadrature-polarization has been proposed as a means to visualize devices that interact with the RF field.

3. Optimization of the RF field distribution
Find an optimized input drive scale V (i.e. input voltage or input current) for each transmit channel such that:

a. The electric field $(E(x)=S_E(x)*V)$ is minimized in the area of the implant. Especially, in the case of an elongated implant, the electric field component tangential to this implant is minimized. The electric field components in directions normal to an elongated implant might be tolerable.

b. The magnetic field $(B1(x)=S_{B1}(x)*V)$ is minimized in the area of the implant. Especially, in the case of an implant forming loops (maybe in combination with the surrounding tissue), the magnetic field component that constitutes a flux through these loops is minimized. Minimization can be performed either to zero or to a magnetic field small enough to be safe but still suitable for imaging of the implant and its surrounding region.

c. The active (i.e., clockwise-polarized) magnetic field component $(B1(x)=S_{B1}(x)*V)$ in the region of interest (ROI) that is chosen for imaging is suitably designed such that MRI imaging is feasible. Thus, in the ROI, the active component should be as large and as constant as possible.

4. MRI image acquisition
MRI image acquisitions are performed with the drive scale V optimized as described above, i.e., which leads to minimal RF heating of the medical device in the patient, and simultaneously, to the best possible image quality.

Figure 4:
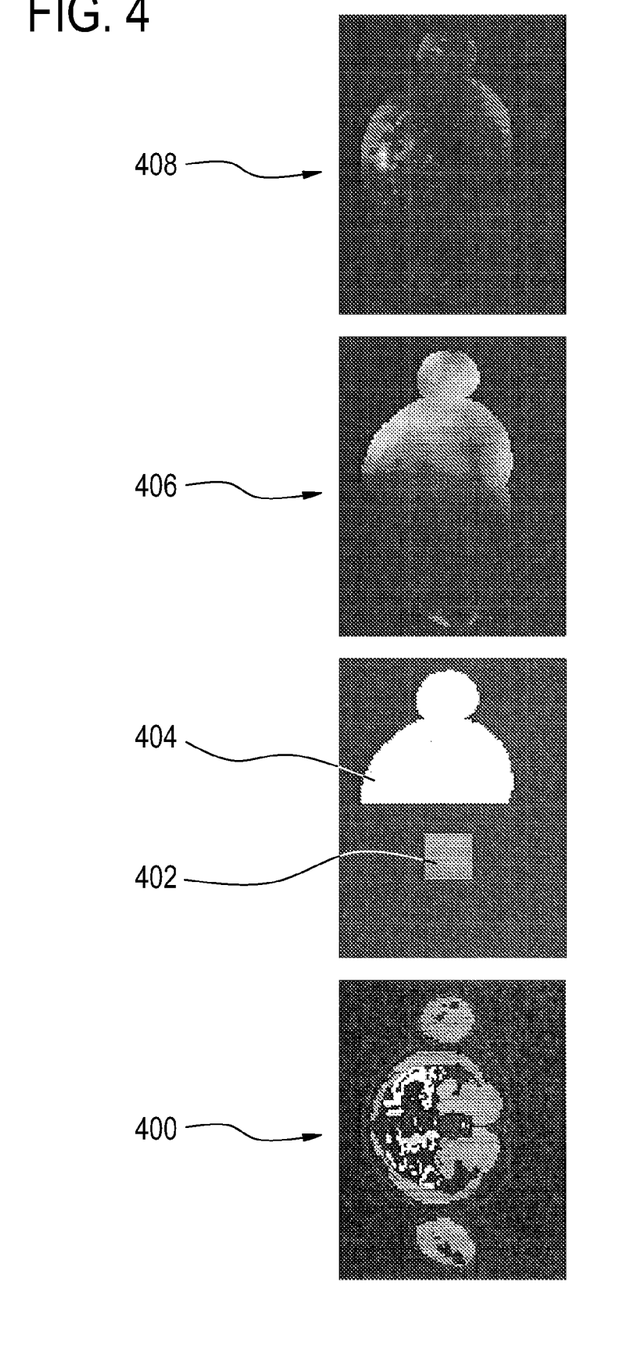
FIG. 4 illustrates simulation results performed to illustrate the simultaneous localized control on the electromagnetic field components for parallel transmit MRI.

FIG. 4 illustrates simulation results performed to study the feasibility of simultaneous localized control on the electromagnetic field components for parallel transmit MRI. Image 400 shows a model of an 8-channel RF coil loaded with a patient model which was modeled using a finite difference time domain scheme. The finite difference model was used to obtain the electric and magnetic field sensitivities. A transversal plane of the body model is shown in image 400. The region labeled 402 is an area in the imaging plane which indicates the location of an electrically conductive object. The region 404 indicates a region where it is desired to perform magnetic resonance imaging. Image 406 shows the resulting magnetic field from the calculation. Image 408 shows the resulting electric field. It can be noted from these Figs. that the magnetic field 406 and electric field 408 are minimal in the region 402.

This figure 400 shows a transversal plane of the body model. Two areas in the imaging plane were delineated. The gray box 402 indicates an area with an electrically conductive object present, where the electric and the magnetic fields are to be minimized. The white area 404 delineates the area where MRI imaging is desired. An optimization algorithm was used to calculate the magnetic field component, shown in 406, and the electrical field component, shown in 408, that optimally fulfill the requirements. Note that both fields are close to zero in the area of the implant but that sufficient magnetic field is present in the imaging area.

The invention has applications in a manifold of clinical MRI examinations for patients with implanted medical devices or where additional equipment needs to be placed in an MRI scanner along with the patient. Such situations include scanning of patients with implanted defibrillators, cardiac pacemakers, deep brain stimulators, joint replacements, hearing implants among others. Medical equipment can also include breathing aids or monitoring of vital signs (e.g. ECG).

Another large area of applications are MR guided interventional procedures where catheters, biopsy needles or other surgical equipment may otherwise lead to potentially unsafe conditions at the exposure to an RF field.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A magnetic resonance imaging system for acquiring magnetic resonance data from a subject within an imaging zone, wherein the magnetic resonance imaging system comprises:

a radio-frequency transmitter for generating a radio-frequency transmit field for acquiring the magnetic resonance data using a radio-frequency antenna, wherein the radio-frequency transmitter has multiple transmit channels, wherein the radio-frequency antenna comprises multiple antenna elements, wherein each of the multiple transmit channels are adapted to connect to an antenna element chosen from the multiple antenna elements;

a memory for storing machine executable instructions; and a processor for executing the machine executable instructions, wherein the processor is configured for controlling the magnetic resonance imaging system, wherein execution of the instructions causes the processor to:

receive a set of radio-frequency sensitivities, wherein the radio-frequency sensitivities are descriptive of the radio-frequency sensitivities of the multiple antenna elements when the subject is within the imaging zone;

calculate a set of input drive scales for the multiple transmit channels in accordance with the radio-frequency sensitivities, wherein an input drive scale is descriptive of the amplitude and phase of radio-frequency transmit field generated by each of the multiple antenna elements, wherein the input drive scales reduce a magnetic field generated by the radio-frequency antenna within a predetermined volume to below a first predetermined value, wherein the predetermined volume is within the subject;

wherein an electrically conductive object is located within the predetermined volume and wherein execution of the instructions further causes the processor to determine an orientation of the electrically conductive object using the preliminary magnetic resonance data, and further calculate the set of input drive scales at least partially using the orientation of the electrically conductive object and acquire the magnetic resonance data using the magnetic resonance imaging system, wherein the radio-frequency transmit field is generated in accordance with the set of input drive scales.

2. The magnetic resonance imaging system of claim 1, wherein execution of the instructions causes the processor to:

acquire preliminary magnetic resonance data using the magnetic resonance imaging system, locate the predetermined volume using the preliminary magnetic resonance data.

3. The magnetic resonance imaging system of claim 2, wherein execution of the instructions further causes the processor to calculate the set of input drive scales such that radio-frequency heating of the electrically conductive object and/or patient tissue within a predetermined distance of the electrically conductive object is reduced.

4. The magnetic resonance imaging system of claim 2, wherein execution of the instructions further causes the processor to:

determine a position of the electrically conductive object; wherein the set of input drive scales are further calculated at least partially using the position of the electrically conductive object such that radio-frequency heating of the electrically conductive object and/or patient tissue within a predetermined distance of the electrically conductive object is reduced.

5. The magnetic resonance imaging system of claim 3, wherein the set of input drive scales are calculated at least partially using a model of the electrically conductive object.

6. The magnetic resonance imaging system of claim 2, wherein execution of the instructions causes the processor to at least partially calculate the set of radio-frequency sensitivities using the preliminary magnetic resonance data and an electromagnetic model of the subject.

7. The magnetic resonance imaging system of claim 2, wherein the radio-frequency sensitivities comprise magnetic field sensitivities.

8. The magnetic resonance imaging system of claim 7, wherein execution of the instructions causes the processor to measure the magnetic field sensitivities using the magnetic resonance imaging system.

9. The magnetic resonance imaging system of claim 7, wherein the radio-frequency sensitivities comprise electric field sensitivities, and wherein the electric field sensitivities are calculated at least partially using the magnetic field sensitivities.

10. The magnetic resonance imaging system of claim 9, wherein the set of input drive scales is calculated at least partially using the electric field sensitivities, wherein the radio-frequency transmit field generated by the radio-frequency transmitter in the predetermined volume is sufficient to enable magnetic resonance imaging.

11. The magnetic resonance imaging system of claim 1, further including a display device and wherein execution of the instructions further causes the processor to:

reconstruct the magnetic resonance image data into a magnetic resonance image; and controlling the display device to display the reconstructed image representation.

12. A magnetic resonance imaging system for acquiring magnetic resonance data from a subject within an imaging zone, wherein an electrically conductive object is in the imaging zone, the magnetic resonance imaging system comprising:

a radio-frequency antenna including a multiple antenna elements;

a multi-channel radio-frequency transmitter configured to generate a radio-frequency transmit field for exciting the magnetic resonance, the multi-channel transmitter being connected to the multiple antenna elements;

a receiver configured to receive magnetic resonance data;

a processor configured to:

control the multi-channel transmitter to generate preliminary magnetic resonance data;

analyze the preliminary magnetic resonance data to deteimine a location and orientation of the electrically conductive object;

preliminary calculate a set of radio-frequency sensitivities of the multiple antenna elements using the preliminary magnetic resonance data, an electromagnetic model of the electrically conductive object, and the orientation of the electrically conductive object;

calculate an input drive scale descriptive of amplitude and phase of radio-frequency transmit field to be generated by each of the multiple antenna elements such that the input derive scales that both minimize electric fields in the location of the determined electrically conductive object location and reduce magnetic fields in the determined electrically conductive volume location;

control the radio-frequency transmitter to acquire magnetic resonance imaging data using a radio-frequency transmit field generated in accordance with the calculated set of input drive scales.

13. The magnetic resonance imaging system of claim 12, wherein the processor is further configured to reconstruct the magnetic resonance imaging data into a diagnostic image.

14. The magnetic resonance imaging system of claim 13, further including:

at least one of a computer memory configured to store the magnetic resonance image and a display device configured to display the magnetic resonance image.

15. A method of operating a magnetic resonance imaging system for acquiring magnetic resonance data from a subject within an imaging zone, wherein the magnetic resonance imaging system comprises a radio-frequency transmitter for generating a radio-frequency transmit field for acquiring the magnetic resonance data using a radio-frequency antenna, wherein the radio-frequency transmitter has multiple transmit channels, wherein the radio-frequency antenna comprises multiple antenna elements, wherein each of the multiple transmit channels is adapted to connect to an antenna element chosen from the multiple antenna elements, the method comprising:

receiving a set of radio-frequency sensitivities, wherein the radio-frequency sensitivities are descriptive of the radio-frequency sensitivities of the multiple antenna elements when the subject is within the imaging zone;

calculating a set of input drive scales for the multiple transmit channels in accordance with the radio-frequency sensitivities, wherein an input drive scale is descriptive of the amplitude and phase of radio-frequency transmit field generated by each of the multiple antenna elements, wherein the input drive scales reduce a magnetic field generated by the radio-frequency antenna within a predetermined volume to below a first predetermined value, wherein the predetermined volume is within the subject;

wherein an electrically conductive object is located within the predetermined volume and wherein execution of the instructions further causes the processor to determine an orientation of the electrically conductive object using the preliminary magnetic resonance data, and wherein the set of input drive scales are further calculated at least partially using the orientation of the electrically conductive object and acquiring the magnetic resonance data using the magnetic resonance imaging system, wherein the radio-frequency transmit field is generated in accordance with the set of input drive scales.

16. The method of claim 15, wherein the method further comprises placing the subject at least partially within the imaging zone.

17. The method of claim 16, further including:
reconstructing a magnetic resonance image from the acquired magnetic resonance data.

18. The method of claim 17, further including:
controlling a display device to display the magnetic resonance image.

19. A non-transitory computer-readable medium carrying machine executable instructions for execution by a processor configured for controlling a magnetic resonance imaging system, wherein the magnetic resonance imaging system is configured for acquiring magnetic resonance data from a subject within an imaging zone, wherein the magnetic resonance imaging system comprises a radio-frequency transmitter for generating a radio-frequency transmit field for acquiring the magnetic resonance data using a radio-frequency antenna, wherein the radio-frequency transmitter has multiple transmit channels, wherein the radio-frequency antenna comprises multiple antenna elements, wherein each of the multiple transmit channels are adapted to connect to an antenna element chosen from the multiple antenna elements, wherein execution of the instructions causes the processor to:

receive a set of radio-frequency sensitivities, wherein the radio-frequency sensitivities are descriptive of the radio-frequency sensitivities of the multiple antenna elements when the subject is within the imaging zone;

calculate a set of input drive scales for the multiple transmit channels in accordance with the radio-frequency sensitivities, wherein an input drive scale is descriptive of the amplitude and phase of radio-frequency transmit field by each of the multiple antenna elements, wherein the input drive scales reduce a magnetic field generated by the radio-frequency antenna within a predetermined volume to below a first predetermined value, wherein the predetermined volume is within the subject;

wherein an electrically conductive object is located within the predetermined volume and wherein execution of the instructions further causes the processor to determine an orientation of the electrically conductive object using the preliminary magnetic resonance data, and wherein the set of input drive scales are further calculated at least partially using the orientation of the electrically conductive object and acquire the magnetic resonance data using the magnetic resonance imaging system, wherein the radio-frequency transmit field is generated in accordance with the set of input drive scales.

\* \* \* \* \*